US008519697B2

(12) United States Patent
Kim et al.

(10) Patent No.: US 8,519,697 B2

(45) Date of Patent: Aug. 27, 2013

(54) APPARATUS AND METHOD FOR DETECTING MODE CHANGE IN AN ELECTRONIC DEVICE

(75) Inventors: Sung-Su Kim, Suwon-si (KR); Man-Ho Han, Cheongju-si (KR); Tae-Yong Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 298 days.

(21) Appl. No.: 12/880,546

(22) Filed: Sep. 13, 2010

(65) Prior Publication Data

US 2011/0068772 A1 Mar. 24, 2011

(30) Foreign Application Priority Data

Sep. 21, 2009 (KR) ........................ 10-2009-0088894

(51) Int. Cl.
*G01R 19/18* (2006.01)

(52) U.S. Cl.
USPC ................. 324/120; 324/207.23; 324/207.25; 200/19.078; 200/179

(58) Field of Classification Search
USPC ............... 324/120, 207.23, 207.25, 704, 705, 324/713; 200/179, 19.07, 19.18
See application file for complete search history.

(56) References Cited

U.S. PATENT DOCUMENTS

| | | | | |
|---|---|---|---|---|
| 4,034,364 | A * | 7/1977 | Fukuda et al. | 341/158 |
| 5,200,752 | A * | 4/1993 | Goeke | 341/168 |
| 5,714,679 | A * | 2/1998 | Nichols et al. | 73/35.08 |
| 5,831,568 | A * | 11/1998 | Mohr | 341/166 |
| 6,037,779 | A * | 3/2000 | Deweerdt et al. | 324/503 |
| 6,310,590 | B1 * | 10/2001 | Havel | 345/83 |
| 6,624,640 | B2 * | 9/2003 | Lund et al. | 324/678 |
| 6,696,984 | B2 * | 2/2004 | Choi | 341/6 |
| 7,034,517 | B2 * | 4/2006 | Newcombe | 324/115 |
| 7,705,584 | B2 * | 4/2010 | Yokotani et al. | 324/173 |
| 2002/0176161 | A1 * | 11/2002 | Yoneyama et al. | 359/391 |
| 2009/0206864 | A1 * | 8/2009 | Gurevitch et al. | 324/763 |

* cited by examiner

*Primary Examiner* — Tung X Nguyen
*Assistant Examiner* — Thang Le
(74) *Attorney, Agent, or Firm* — Jefferson IP Law, LLP

(57) ABSTRACT

An apparatus and method for detecting a mode change in an electronic device are provided. The apparatus includes a rotary switch including a common port and a plurality of contact points corresponding to a plurality of modes, a comparator for comparing a voltage of the common port with a reference voltage to output a resultant signal, a measurement unit for measuring the voltage of the common port according to the resultant signal of the comparator, and a Micro Control Unit (MCU) for evaluating a changed mode based on the measured voltage.

12 Claims, 8 Drawing Sheets

APPARATUS AND METHOD FOR DETECTING MODE CHANGE IN AN ELECTRONIC DEVICE

This application claims the benefit under 35 U.S.C. §119 (a) of a Korean patent application filed in the Korean Intellectual Property Office on Sep. 21, 2009 and assigned Serial No. 10-2009-0088894, the entire disclosure of which is hereby incorporated by reference.

BACKGROUND OF THE INVENTION

1. Field of the Invention

The present invention relates to an apparatus and method for detecting a mode change in an electronic device. More particularly, the present invention relates to an apparatus and method for detecting a mode change depending on an operation of a rotary switch.

2. Description of the Related Art

Today, various electronic devices using rotary switches have been launched. For example, the rotary switches are used in microwave ovens, Digital Multi-Meters (DMM), and cameras.

FIG. 1 illustrates a structure of a rotary switch in the conventional electric device.

Referring to FIG. 1, the rotary switch includes a common port and a plurality of contact points, each contact point corresponding to a plurality of modes. The rotary switch rotates under the control of a user to connect the common port to a specific contact point so that the electronic device may operate in a specific mode corresponding to the specific contact point. In this case, the electronic device may operate in a mode selected by the user by using a controller (i.e., a Micro Control Unit (MCU) or a Central Processing Unit (CPU)) to determine which contact point is connected to the common port.

FIG. 2 illustrates a circuit diagram for determining a mode selected by a rotary switch in a conventional electronic device.

Referring to FIG. 2, the contact points may be connected to a pull-down input port of the MCU. If a voltage is supplied to the common port such that the contact points are all connected to the input port of the MCU, a current flows only to the contact points connected to the common port. Therefore, the contact points connected to the common port may be determined by sequentially determining the input port of the MCU or by applying an interrupt condition to each input port. However, in this method, the number of required input ports of the MCU is equal to the number of the contact points.

FIG. 3 illustrates a circuit diagram for determining a mode selected by a rotary switch in a conventional electronic device.

Referring to FIG. 3, according to another conventional method, the pull-up circuit is constructed in a common port and the pull-down circuit having a different resistance is established via each contact point. Thus, a voltage level of the common port is evaluated by using the Analog to Digital Converter (ADC) to determine a contact point currently connected to the common port. However, this method has a disadvantage in that the voltage level of the common port has to be periodically evaluated by using the ADC since it cannot be known when a switching operation will be performed in a rotary switch. Although the second method of using the ADC has an advantage in that a smaller number of input ports are used in comparison with the method of using the input port and the contact point of the MCU, the second method also has a disadvantage in terms of software tasks and power consumption in an idle state.

SUMMARY OF THE INVENTION

An aspect of the present invention is to address at least the above-mentioned problems and/or disadvantages and to provide at least the advantages described below. Accordingly, an aspect of the present invention is to provide an apparatus and method for detecting a mode change in an electronic device.

Another aspect of the present invention is to provide an apparatus and method for detecting a mode change depending on an operation of a rotary switch in an electronic device.

Another aspect of the present invention is to provide an apparatus and method for detecting a mode change by generating an interrupt according to an operation of a rotary switch in an electronic device.

Another aspect of the present invention is to provide an apparatus and method for detecting a mode change depending on an operation of a rotary switch by using a comparator in an electronic device.

Another aspect of the present invention is to provide an apparatus and method for detecting a mode change by using a dead point generated when a rotation operation of a rotary switch is performed in an electronic device.

In accordance with an aspect of the present invention, an apparatus for detecting a mode change in an electronic device is provided. The apparatus includes a rotary switch including a common port and a plurality of contact points corresponding to a plurality of modes, a comparator for comparing a voltage of the common port with a reference voltage to output a resultant signal, a measurement unit for measuring the voltage of the common port according to the resultant signal of the comparator, and a Micro Control Unit (MCU) for evaluating a changed mode based on the measured voltage.

In accordance with another aspect of the present invention, a method of detecting a mode change in an electronic device is provided. The method includes identifying a change in an output value of a comparator for receiving a voltage of a common port and a reference voltage, measuring a voltage level of the common port when the output value changes, and determining a changed mode based on the measured voltage level.

In accordance with another aspect of the present invention, an electronic device is provided. The electronic device includes a rotary switch including a common port and a plurality of contact points, each contact point corresponding to one of a plurality of modes, a measurement unit for measuring the voltage of the common port, and a control unit for determining whether an output of a comparator comparing a voltage of the common port with a reference voltage has changed, and for controlling the measurement unit to measure the voltage of the common port when the output of the comparator has changed.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding, but these are to be regarded as merely exemplary. Those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention is provided for illustration purposes only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The present invention relates to an apparatus and method for detecting a mode change by generating an interrupt according to an operation of a rotary switch in an electronic device.

Figure 1:
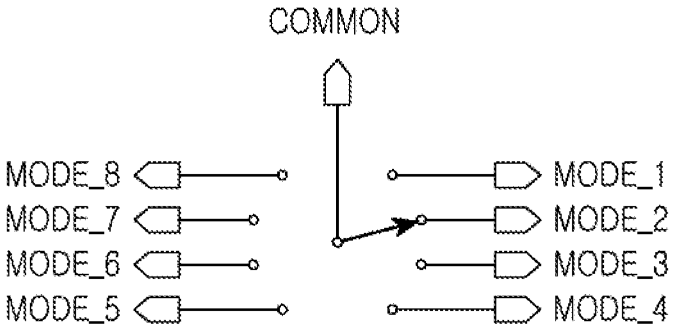
FIG.1 (CONVENTIONAL ART)
FIG. 1 illustrates a structure of a rotary switch in a conventional electric device.
Figure 2:
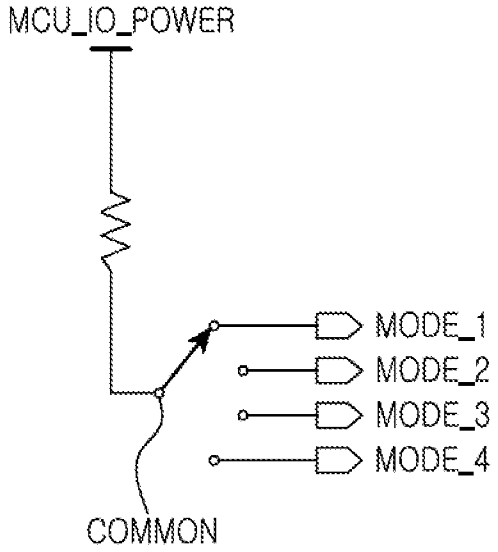
FIG.2 (CONVENTIONAL ART)
FIG. 2 illustrates a circuit diagram for determining a mode selected by a rotary switch in a conventional electronic device.
Figure 3:
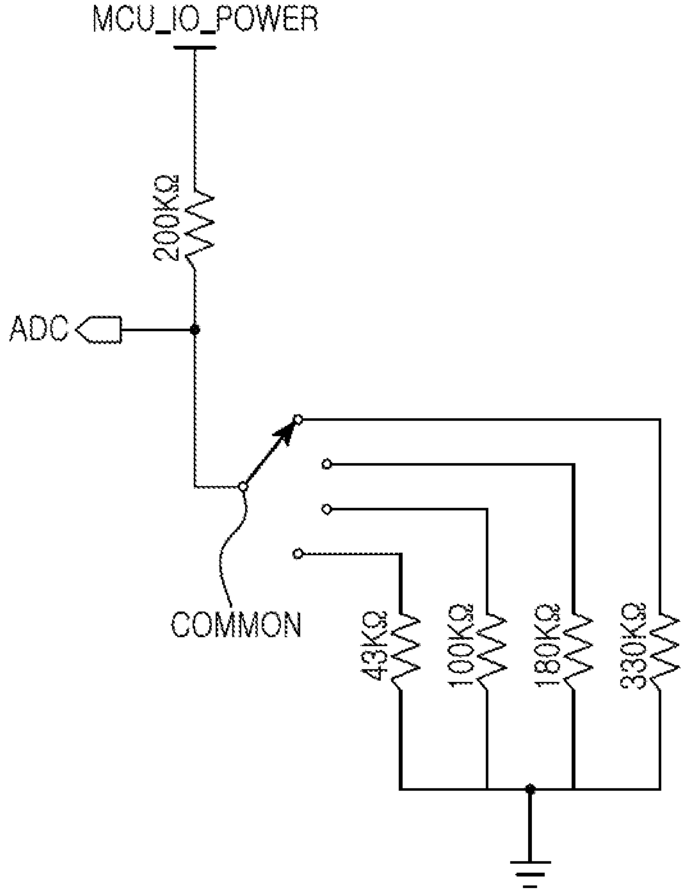
FIG.3 (CONVENTIONAL ART)
FIG. 3 illustrates a circuit diagram for determining a mode selected by a rotary switch in a conventional electronic device.
Figure 4:
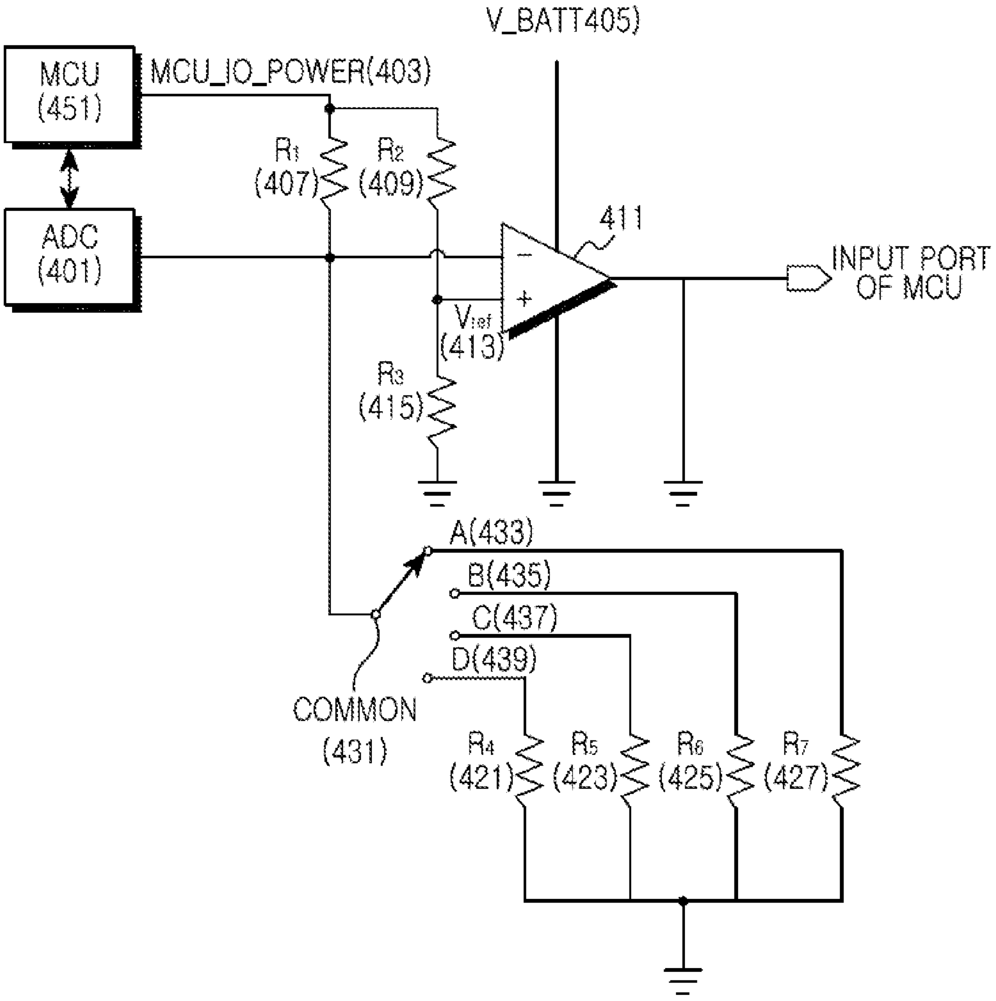
FIG. 4 illustrates a circuit diagram for determining a mode selected by a rotary switch according to an exemplary embodiment of the present invention.
Figure 5:
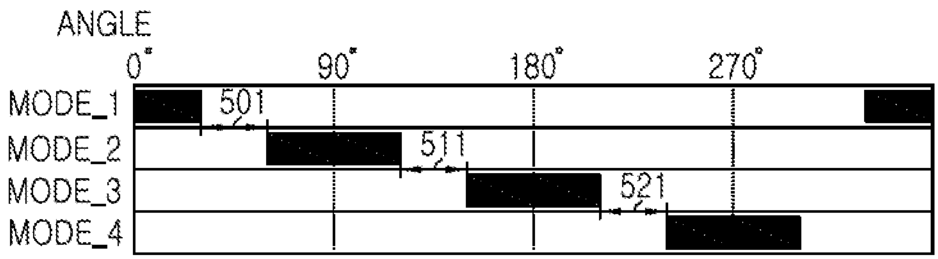
FIG. 5 illustrates a dead point depending on rotation of a rotary switch in an electronic device according to an exemplary embodiment of the present invention.
Figure 6A:
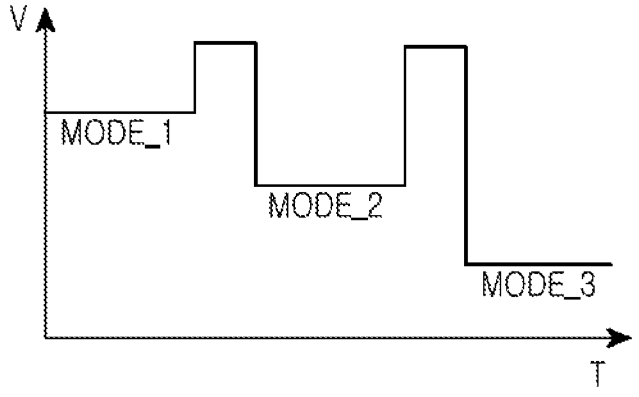
FIG. 6A and FIG. 6B are graphs comparing a voltage level of an Analog to Digital Converter (ADC) and a voltage level of a comparator depending on a mode selected by a rotary switch in an electronic device according to an exemplary embodiment of the present invention.
Figure 6B:
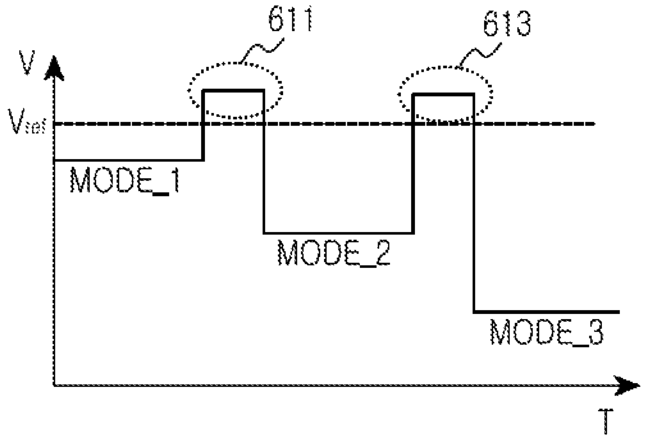

FIG. 4 illustrates a circuit diagram for determining a mode selected by a rotary switch in an electronic device according to an exemplary embodiment of the present invention. Although exemplary circuits described herein have four modes, each of which has four contact points corresponding thereto, exemplary embodiments of the present invention may also equally apply to a case where the number of contact points corresponding to each mode differs. FIG. 5 illustrates a dead point depending on rotation of a rotary switch in an electronic device according to an exemplary embodiment of the present invention. FIG. 6A and FIG. 6B are graphs comparing a voltage level of an Analog to Digital Converter (ADC) and a voltage level of a comparator depending on a mode selected by a rotary switch in an electronic device according to an exemplary embodiment of the present invention.

Referring to FIG. 4, the electronic device includes a common port 431 of the rotary switch, contact points A 433, B 435, C 437, and D 439 corresponding to a plurality of modes, a pull-up resistor $R_1$ 407 connected to the common port 431, an ADC 401 connected to the common port 431, pull-down resistors $R_4$ 421, $R_5$ 423, $R_6$ 425, and $R_7$ 427 respectively connected to the contact points A 433, B 435, C 437, and D 439, a comparator 411, resistors $R_2$ 409 and $R_3$ 415 connected to the comparator 411, a power source V_Batt 405 for supplying power to the comparator 411, and a Micro Control Unit (MCU) 451.

The rotary switch includes the common port 431 and the plurality of contact points A 433, B 435, C 437, and D 439 depending on the plurality of modes. According to the user's manipulation, the rotary switch connects the common port 431 to a specific contact point among the plurality of contact points A 433, B 435, C 437, and D 439. The common port 431 has a different voltage level depending on a pull-down resistor value corresponding to the connected contact point.

The pull-down resistors $R_4$ 421, $R_5$ 423, $R_6$ 425, and $R_7$ 427 allow a specific point to have a low signal when the specific point is in a floating state in a normal case. Each pull-down resistor is located between a ground and a switch and serves to allow the specific point to be in a low state in the normal case where the switch is not connected or to allow the specific point to be in a high state when the switch is connected.

The pull-up resistor $R_1$ 407 allows a specific point to have a high signal when the specific point is in the floating state in the normal case. The pull-up resistor $R_1$ 407 is located between the power source and the switch and allows the specific point to be in the high state in the normal case where the switch is not connected or to allow the specific point to be in the low state when the switch is connected.

Referring to FIG. 5, since the common port 431 has a different voltage level depending on a connected contact point, a specific contact point to which the common port 431 is connected may be known via the ADC 401. In this case, the common port 431 has dead points 501, 511, and 521 to which no contact point is connected according to a switching angle of the rotary switch. The common port 431 has the same voltage as the pull-up voltage, and the voltage of the dead points is higher than a reference voltage $V_{ref}$ 413 supplied to the comparator 411. The common port 431 has a different voltage level according to a connected contact point as illustrated in FIG. 6A, and has a voltage level higher than the reference voltage $V_{ref}$ 413 at the dead points 611 and 613 as illustrated in FIG. 6B.

Referring back to FIG. 4, the ADC 401 converts an analog signal flowing to the common port 431 into a digital signal, measures the voltage of the digital signal, and provides the measured voltage to the MCU 451. Instead of continuously measuring the voltage of the common port 431, the ADC 401 measures the voltage of the common port 431 only when an interrupt signal is input from the MCU 451.

The MCU 451 provides a voltage to the common port 431 through a MCU_IO_Power 403, generates an interrupt according to an output value of the comparator 411, and provides the interrupt to the ADC 401. The MCU 451 generates an interrupt when the output value of the comparator 411 changes from High to Low. After the interrupt is generated, the MCU 451 determines a specific mode of a contact point connected to the common port 431 based on the voltage level provided from the ADC 401. Since the common port 431 has a different voltage level according to a connected contact point, as illustrated in FIG. 6A, a specific mode of a connect point connected thereto may be determined based on the voltage level.

The comparator 411 outputs a high signal if an input of a negative terminal is less than the reference voltage $V_{ref}$ 413 input to a positive terminal, and outputs a low signal if the input of the negative terminal is greater than the reference voltage $V_{ref}$ 413. In this case, the voltage provided from the MCU_IO_Power 403 is divided between the resistors $R_2$ 409 and $R_3$ 415 and is input to the comparator 411 as the reference voltage $V_{ref}$ 413. The voltage of the common port 431 is input to the negative terminal.

Referring to FIG. 6B, as illustrated, the comparator 411 outputs a high signal when the voltage of the common port 431, which is to be input to the negative terminal, is less than the reference voltage $V_{ref}$ 413, and outputs a low signal when the voltage of the common port 431, which is to be input to the negative terminal, is greater than the reference voltage $V_{ref}$ 413. An output port of the comparator 411 is connected to an input port of the MCU 451, and thus the MCU 451 may detect an output signal of the comparator 411.

A method of determining a mode change depending on an operation of a rotary switch in an electronic device will be described by taking examples based on the aforementioned descriptions of FIG. 3 to FIG. 6.

When the user rotates the rotary switch in a state where the common port 431 of the rotary switch is connected to the contact point A 433 corresponding to a mode 1, the common port 431 passes the dead point 501 which is connected to neither the contact point A 433 corresponding to the mode 1 nor the contact point B 435 due to the rotation of the rotary switch. At the dead point 501, a voltage level of the common port 431 changes to a value greater than the reference voltage $V_{ref}$ 413 and thus the comparator 411 outputs a low signal. Upon detecting this, the MCU 451 generates an interrupt and controls the ADC 401 to measure the voltage level of the common port 431. Thereafter, based on the measured voltage level, the MCU 451 determines to which contact point the rotary switch is connected.

Figure 7:
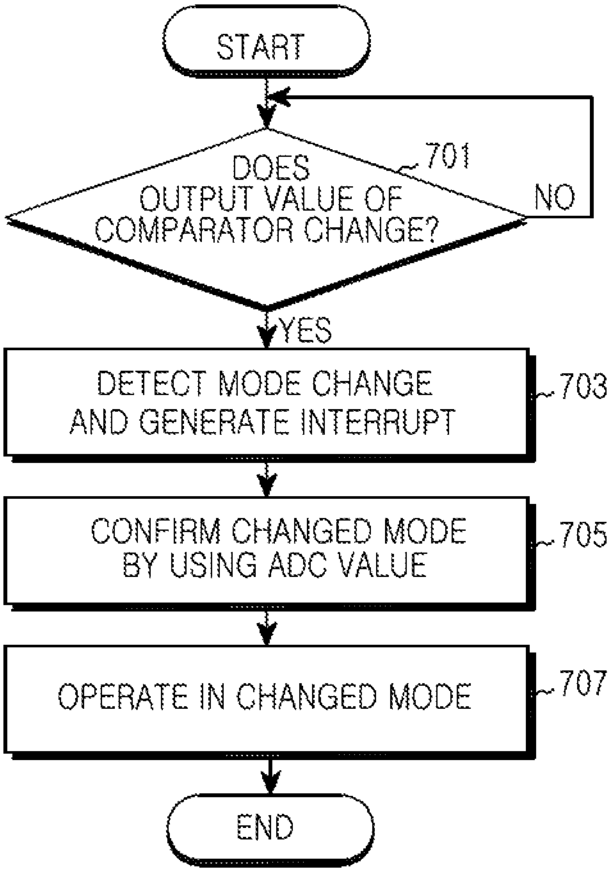
FIG. 7 illustrates a process of determining a mode selected by a rotary switch in an electronic device according to an exemplary embodiment of the present invention.

FIG. 7 is a flowchart illustrating a process of determining a mode selected by a rotary switch in an electronic device according to an exemplary embodiment of the present invention.

Referring to FIG. 7, the electronic device determines whether an output value of the comparator 411 changes from High to Low in step 701. If the output value of the comparator 411 changes to Low, proceeding to step 703, the electronic device detects a mode change caused by switching of the rotary switch, and generates an interrupt for confirming the changed mode. In step 705, the electronic device measures a voltage level of the common port by using the ADC 401 and confirms the mode changed by the switching of the rotary switch. In step 707, the electronic device operates in the changed mode.

According to exemplary embodiments of the present invention, a dead point generated by a switching operation of a rotary switch is detected by using a comparator in an electronic device, and thereafter an interrupt is generated to detect a mode change. In doing so, the number of available input ports of an MCU may be decreased. Further, since an ADC is used only when the interrupt is generated, current consumption may be decreased.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for detecting a mode change in an electronic device, the apparatus comprising:
- a rotary switch including a common port and a plurality of contact points corresponding to a plurality of modes;
- a comparator for comparing a voltage of the common port with a reference voltage to output a resultant signal;
- a measurement unit for measuring the voltage of the common port according to the resultant signal of the comparator; and
- a Micro Control Unit (MCU) for evaluating a changed mode based on the measured voltage.

2. The apparatus of claim 1, wherein the reference voltage is input to the comparator by dividing an input voltage provided to the common port between two resistors.

3. The apparatus of claim 1, wherein the comparator outputs a signal for voltage measurement by receiving a value higher than the reference signal as the voltage of the common port when the common port is not connected to any contact point among the plurality of contact points.

4. The apparatus of claim 3, wherein the MCU controls the measurement unit to measure the voltage of the common port when the signal for voltage measurement is output from the comparator.

5. The apparatus of claim 1, further comprising:
- a pull-up resistor for connecting the common port with a power source; and
- a pull-down resistor for connecting each of the plurality of contact points with a ground.

6. A method of detecting a mode change in an electronic device, the method comprising:
- identifying a change in an output value of a comparator for receiving a reference voltage and a voltage of a common port of a rotary switch;
- measuring a voltage level of the common port when the output value changes; and
- determining a changed mode based on the measured voltage level,
- wherein an output value of the comparator is a resultant signal for voltage measurement when the common port is not connected to any contact point among the plurality of contact points by a switching operation of the rotary switch.

7. The method of claim 6, wherein the reference voltage is obtained by dividing an input voltage provided to the common port between two resistors.

8. The method of claim 6, wherein the measuring of the voltage level of the common port comprises measuring a voltage of the common port by generating an interrupt when a signal for voltage measurement is output from the comparator.

9. An electronic device, comprising:
- a rotary switch including a common port and a plurality of contact points, each contact point corresponding to one of a plurality of modes;
- a measurement unit for measuring the voltage of the common port; and
- a control unit for determining whether an output of a comparator comparing a voltage of the common port with a reference voltage has changed, and for controlling the measurement unit to measure the voltage of the common port when the output of the comparator has changed.

10. The electronic device of claim 9, wherein the measurement unit is an Analog to Digital Converter (ADC).

11. The electronic device of claim 9, wherein the control unit is a Micro Control Unit (MCU).

12. The electronic device of claim 9, wherein the output signal of the comparator is a resultant value for voltage measurement when the common port is not connected to any of the plurality of contact points.

* * * * *